(12) United States Patent
Minamio et al.

(10) Patent No.: US 8,754,510 B2
(45) Date of Patent: Jun. 17, 2014

(54) CONDUCTION PATH, SEMICONDUCTOR DEVICE USING THE SAME, AND METHOD OF MANUFACTURING CONDUCTION PATH, AND SEMICONDUCTOR DEVICE

(75) Inventors: Masanori Minamio, Osaka (JP); Zyunya Tanaka, Osaka (JP); Ryoutarou Imura, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/577,362

(22) PCT Filed: Nov. 30, 2011

(86) PCT No.: PCT/JP2011/006709
§ 371 (c)(1),
(2), (4) Date: Aug. 6, 2012

(87) PCT Pub. No.: WO2012/077305
PCT Pub. Date: Jun. 14, 2012

(65) Prior Publication Data
US 2012/0299166 A1  Nov. 29, 2012

(30) Foreign Application Priority Data
Dec. 10, 2010 (JP) .................................. 2010-275329

(51) Int. Cl.
*H01L 23/495* (2006.01)
(52) U.S. Cl.
USPC ..... 257/674; 257/690; 257/666; 257/E23.047

(58) Field of Classification Search
CPC ...... H01L 23/34; H01L 23/48; H01L 2224/84
USPC .................... 257/674, 666, 698, 690, E23.047
See application file for complete search history.

(56) References Cited

U.S. PATENT DOCUMENTS

| | | | |
|---|---|---|---|
| 6,256,200 B1 * | 7/2001 | Lam et al. | 361/704 |
| 6,285,549 B1 | 9/2001 | Lee | |
| 6,459,147 B1 * | 10/2002 | Crowley et al. | 257/692 |

(Continued)

FOREIGN PATENT DOCUMENTS

| | | |
|---|---|---|
| GB | 2097298 A | 11/1982 |
| JP | 59-052031 | 12/1984 |

(Continued)

OTHER PUBLICATIONS

International Search Report issued in International Patent Application No. PCT/JP2011/006709 dated Mar. 6, 2012.

(Continued)

*Primary Examiner* — Nitin Parekh
(74) *Attorney, Agent, or Firm* — McDermott Will & Emery LLP (57) ABSTRACT

A conduction path includes a first conduction path forming plate (11) made of a first metal and having a through hole (13), and a second conduction path forming plate (15) made of a second metal and having a press-fit portion (17) press-fitted into the through hole. A wall surface of the through hole and a side surface of the press-fit portion forms an inclined bonding surface (18) inclined relative to a normal line of an overlap surface of the first conduction path forming plate and the second conduction path forming plate, and a bonding portion (25) formed by metal flow is formed in a region located in a periphery of the inclined bonding surface.

9 Claims, 7 Drawing Sheets

(56) References Cited

U.S. PATENT DOCUMENTS

| | | | |
|---|---|---|---|
| 6,630,726 B1 * | 10/2003 | Crowley et al. | 257/666 |
| 6,873,041 B1 * | 3/2005 | Crowley et al. | 257/692 |
| 7,285,849 B2 * | 10/2007 | Cruz et al. | 257/690 |
| 7,732,919 B2 * | 6/2010 | Shimizu et al. | 257/724 |
| 8,299,600 B2 * | 10/2012 | Sato et al. | 257/692 |
| 8,502,539 B2 * | 8/2013 | Lai et al. | 324/318 |
| 2004/0150077 A1 * | 8/2004 | Fujita | 257/666 |
| 2008/0112139 A1 * | 5/2008 | Vinciarelli et al. | 361/709 |
| 2011/0037091 A1 * | 2/2011 | Fushimi | 257/98 |
| 2011/0123240 A1 * | 5/2011 | Tetsuro | 399/346 |

FOREIGN PATENT DOCUMENTS

| | | |
|---|---|---|
| JP | 62-104633 A | 5/1987 |
| JP | 3071095 U | 8/2000 |
| JP | 2003-045920 A | 2/2003 |
| JP | 2005-019948 A | 1/2005 |

OTHER PUBLICATIONS

English machine translation of Japanese Office Action issued in Japanese Application No. 2012-517021 with date of Mar. 11, 2014.

* cited by examiner

CONDUCTION PATH, SEMICONDUCTOR DEVICE USING THE SAME, AND METHOD OF MANUFACTURING CONDUCTION PATH, AND SEMICONDUCTOR DEVICE

RELATED APPLICATIONS

This application is the U.S. National Phase under 35 U.S.C. §371 of International Application No. PCT/JP2011/006709, filed on Nov. 30, 2011, which in turn claims the benefit of Japanese Application No. 2010-275329, filed on Dec. 10, 2010, the disclosures of which Applications are incorporated by reference herein.

TECHNICAL FIELD

The present invention relates to conduction paths for allowing a current to flow, semiconductor devices using such conduction paths, and methods for manufacturing such conduction paths and such semiconductor devices.

BACKGROUND ART

A component of a semiconductor device includes a conduction path. The conduction path is used for, e.g., connecting a semiconductor switching element and a control circuit mounted on an air conditioner together, or connecting a plurality of batteries or capacitors mounted on an electric car together, etc.

As shown in FIGS. 6(a)-6(d), a conduction path generally includes a first conduction path forming plate 51 having a first connection portion, and a second conduction path forming plate 52 having a second connection portion overlapping with the first connection portion of the first conduction path forming plate 51. For example, the first connection portion of the first conduction path forming plate 51 includes a protruding portion 51a which is formed to be incompletely cut to protrude toward the overlapping surface. In contrast, the second connection portion of the second conduction path forming plate 52 includes a through hole 52a which is capable of fitting the protruding portion 51a of the first conduction path forming plate 51 thereinto.

Figure 6:
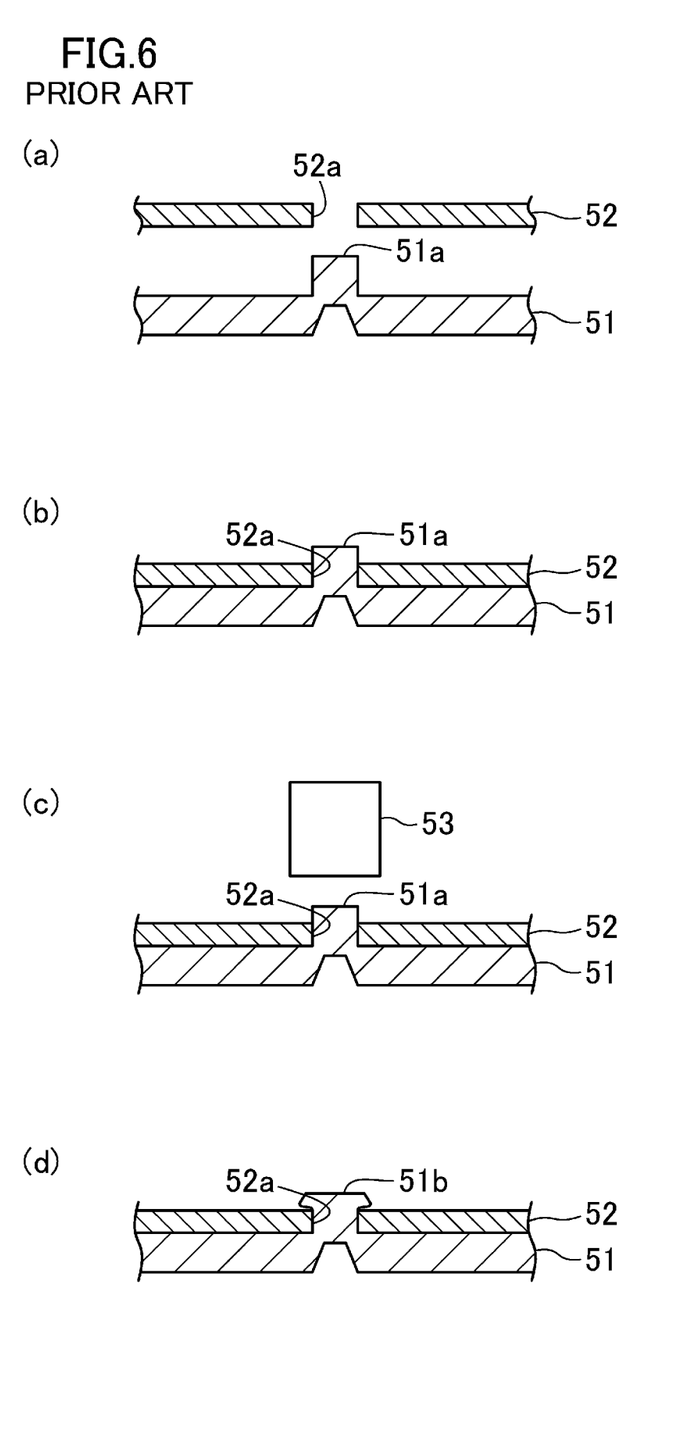
FIGS. 6(a)-6(d) are schematic cross sectional views for showing steps of manufacturing a conventional conduction path in the order of the steps performed.

In order to electrically connect the first conduction path forming plate 51 and the second conduction path forming plate 52 together, first, as shown in FIG. 6(a) and FIG. 6(b), the protruding portion 51a of the first conduction path forming plate 51 is inserted into the through hole 52a of the second conduction path forming plate 52, thereby exposing an upper surface of the protruding portion 51a from the through hole 52a.

Subsequently, as shown in FIG. 6(c), the center of the protruding portion 51a of the first conduction path forming plate 51 exposed from the through hole 52a of the second conduction path forming plate 52 is hammered with a punch 53.

With this process, as shown in FIG. 6(d), an upper part of the protruding portion 51a is pressed and expanded toward a periphery of the through hole 52a of the second conduction path forming plate 52, thereby forming a rivet 51b.

In this way, a side surface of the protruding portion 51a of the first conduction path forming plate 51 is pressure-welded to a wall surface of the through hole 52a of the second conduction path forming plate 52.

However, such a conventional conduction path has a problem where a pressure welding portion between the side surface of the protruding portion 51a and the wall surface of the through hole 52a has a large electrical resistance, and heat is generated in the pressure welding portion by a current.

Specifically, in the conventional conduction path, the side surface of the protruding portion of the first conduction path forming plate is pressed and expanded toward the wall surface of the through hole of the second conduction path forming plate, whereby the side surface of the protruding portion is pressure-welded to the side wall of the through hole. However, on the first conduction path forming plate 51 and the second conduction path forming plate 52, a metal oxide film is formed in the side surface of the protruding portion 51a and the wall surface of the through hole 52a while the plates are stored in the air before assembly. Therefore, simply pressure-welding the conduction path forming plates 51 and 52 leads to connecting the conduction path forming plates 51 and 52 together with the metal oxide film interposed therebetween, and the electric resistance increases, resulting in generation of excessive heat.

Patent Document 1 discloses, as a countermeasure of metal oxide films in interconnections, and the like, of a semiconductor device, deforming a bonding portion between an electrode and an interconnection in a power semiconductor chip to expose a newly formed surface, thereby improving the strength of the bonding portion.

Figure 7:
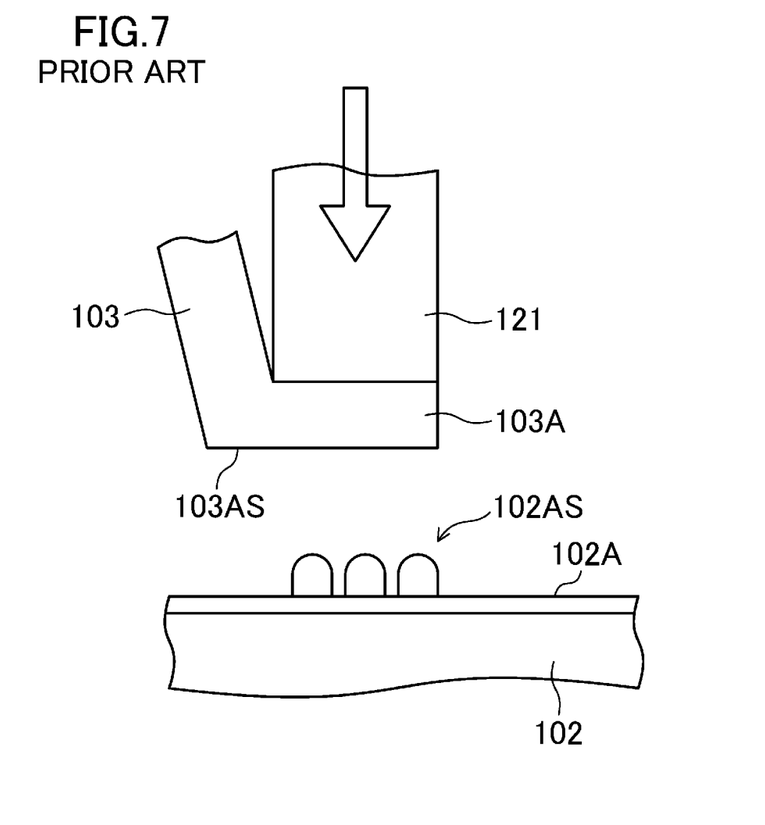
FIG. 7 is a schematic cross sectional view for explaining a method of manufacturing a conventional semiconductor device disclosed in Patent Document 1.

FIG. 7 illustrates a method of manufacturing the semiconductor device disclosed in Patent Document 1. As shown in FIG. 7, an electrode 102A of a semiconductor chip 102 prior to pressure welding has an uneven surface 102AS. In contrast, an interconnection 103 has a connection portion 103A which is pressure-welded to the electrode 102A. A surface 103AS is flat before the pressure welding is performed. A load is applied by an ultrasonic head, thereby performing the pressure welding of the electrode 102 and the connection portion 103A of the interconnection. At the time of the pressure welding, in each of the electrode 102A and the connection portion 103A, a newly formed surface which is not oxidized is exposed. As a result, a bond strength between the electrode 102A and the connection portion 103A can be improved.

Patent Document 2, which belongs to another technical field, discloses a method of pressure-welding two of clean, newly formed surfaces in order to achieve cold pressure welding.

Figure 8:
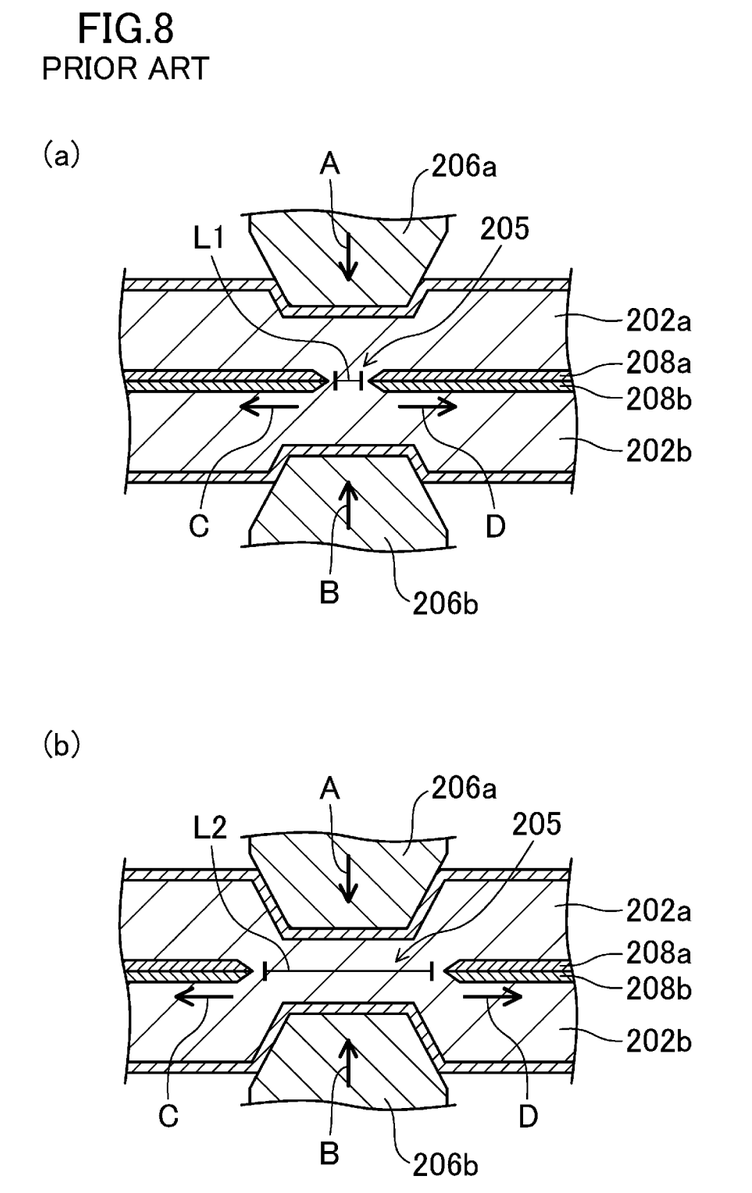
FIGS. 8(a) and 8(b) are cross sectional views for explaining a conventional method of cold pressure welding disclosed in Patent Document 2.

FIGS. 8(a) and 8(b) illustrate a cross sectional structure of a main part of a conventional method of cold pressure welding disclosed in Patent Document 2.

First, as shown in FIG. 8(a), plate bodies 202a and 202b each having plating layers 208a and 208b on both surfaces thereof overlap each other, and cold pressure welding is performed using a cold pressure welding device. The plate bodies 202a are 202b are made of copper (Cu), and the plating layers 208a and 208b are made of nickel (Ni). Together with the progress of the cold pressure welding, wedge-shaped dice 206a and 206b respectively enter plate bodies 202a and 202b while plastically deforming the plate bodies 202a and 202b toward an arrow A direction and an arrow B direction, respectively. At this time, together with the progress of the cold pressure welding, each of the plating layers 208a and 208b is divided at a pressure welding part 205, and moves toward an arrow C direction and an arrow D direction.

Next, as shown in FIG. 8(b), the plating layers 208a and 208b further move toward the arrow C direction and the arrow D direction, respectively, together with the plastic flow of the plate bodies 202a and 202b by the cold pressure welding. That is because the plating layers 208a and 208b cannot follow the plastic flow of the plate bodies 202a and 202b, respectively, by the cold pressure welding, and the plating layers 208a and 208b reach a breaking point before completion of the pressure welding. As a result, after the plating layer 208a and 208b are divided and are moved, two of clean, newly formed surfaces including no oxide film in each of the plate bodies 202a and 202b are exposed, and the exposed, newly formed surfaces are joined by the cold pressure welding.

CITATION LIST

Patent Document

PATENT DOCUMENT 1: Japanese Patent Publication No. 2003-45920
PATENT DOCUMENT 2: Japanese Examined Patent Publication No. S59-52031

SUMMARY OF THE INVENTION

Technical Problem

Regarding formation of a conduction path, when the cold pressure welding method disclosed in Patent Document 2 is used, plating layers and metal oxides at a bonding portion are broken in the horizontal direction, and newly formed surfaces are exposed on the bonding surface. Therefore, the newly formed surfaces can be connected, thereby reducing an electrical resistance at the bonding portion, to some extent.

However, the cold pressure welding disclosed in Patent Document 2 has a problem where in the conduction path through which a larger current flows, an electrical resistance at the bonding portion is not reduced.

It is an object of the present invention to solve the above problem, and reduce an electrical resistance at a bonding portion which bonds conduction path forming plates, through which a larger current flows, together.

Solution to the Problem

In order to solve the above object, a conduction path according to the present invention includes a first conduction path forming plate made of a first metal and having a hole, and a second conduction path forming plate made of a second metal and having a press-fit portion press-fitted into the hole, wherein an inclined bonding surface inclined relative to a normal line of an overlap surface of the first conduction path forming plate and the second conduction path forming plate is formed in a wall surface of the hole and a side surface of the press-fit portion, and a bonding portion formed by metal flow is formed in a region located in a periphery of the inclined bonding surface.

The semiconductor device according to the present invention includes the conduction path of the present invention, a semiconductor chip electrically connected to the conduction path, and an outer body including the conduction path and a resin material encapsulating the semiconductor chip.

A method of manufacturing a conduction path according to the present invention include, with a first conduction path forming plate made of a first metal and having a hole, and a second conduction path forming plate made of a second metal overlapping each other, press-fitting a portion of the second conduction path forming plate opposing the hole into the hole by a press-fit tool, thereby bonding the first conduction path forming plate and the second conduction path forming plate together.

A method of manufacturing a semiconductor device according to the present invention includes, with a semiconductor chip adhered on at least one of a first conduction path forming plate made of a first metal and having a hole or a second conduction path forming plate made of a second metal in advance, and with a region of the first conduction path forming plate having the hole and part of the second conduction path forming plate overlapping each other, press-fitting a portion of the second conduction path forming plate opposing the hole into the hole by a press-fit tool, thereby bonding the first conduction path forming plate and the second conduction path forming plate together, and then, encapsulating the semiconductor chip and a bonding portion between the first conduction path forming plate and the second conduction path forming plate by an outer body made of a resin material.

Advantages of the Invention

According to a conduction path, a semiconductor device using the same, and a method of manufacturing them in the present invention, an electrical resistance in the conduction path and the semiconductor device can be reduced.

DESCRIPTION OF EMBODIMENTS

One Embodiment

A resin-encapsulated semiconductor device and a conduction path constituting the device according to one embodiment of the present invention the will be described with reference to the drawings.

[Semiconductor Device]

Figure 1:
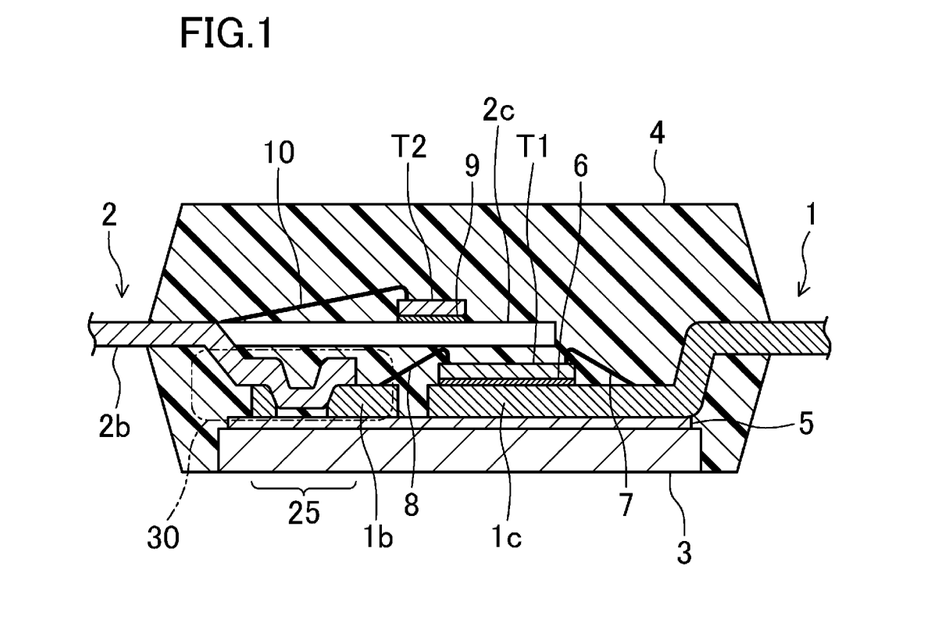
FIG. 1 is a cross sectional view for showing a resin-encapsulated semiconductor device according to one embodiment of the present invention.

FIG. 1 shows a cross sectional structure of a resin-encapsulated semiconductor device according to the embodiment of the present invention.

As shown in FIG. 1, the resin-encapsulated semiconductor device according to the embodiment includes a first lead frame 1 holding a power element T1 on a first die pad portion 1c, a second lead frame 2 holding a control element T2 on a second die pad portion 2c, a dissipating plate 3 adhered to a lower surface of the first lead frame 1 with an insulating sheet 5 interposed therebetween, and an outer body 4 made of an encapsulating resin material which is an example of a resin material.

The outer body 4 is made of a thermosetting resin, for example, an epoxy resin, etc., and covers one end portion of the first lead frame 1 including the power element T1, and one end portion of the second lead frame 2 including the control element T2. The outer body is formed so that a lower surface of the dissipating plate 3 is exposed.

At least part of the first die pad portion 1c and part of the second die pad portion 2 overlap each other when viewed in plan to achieve miniaturization of the resin-encapsulated semiconductor device. Besides, at least part of the power element T1 and part of control element T2 are arranged so as to overlap each other when viewed in plan.

Besides, in the resin-encapsulated semiconductor device according to the embodiment, in the first lead frame 1, one of a plurality of leads is referred to as a first relay lead 1b. In the second lead frame 2, one of a plurality of leads is referred to as a second relay lead 2b.

In a region 30 including a bonding portion 25 according to the present invention, an end portion of the first relay lead 1b and an end portion of the second relay lead 2b form a conduction path bonded by the bonding portion 25.

The resin-encapsulated semiconductor device according to the embodiment will be described in detail hereinafter.

The first lead frame 1 is made of a metal having high conductivity, e.g., copper (Cu), etc., as an example of a first metal. The second lead frame 2 is made of a metal having high conductivity, e.g., copper (Cu), or 42 alloy (Fe-42% Ni), etc., as an example of a second metal.

The dissipating plate 3 is made of a metal having excellent thermal conductivity, e.g., copper or aluminum (Al), etc. Each of the first die pad portion 1c and the first relay lead 1b of the first lead frame 1 is adhered to an upper surface of the dissipating plate 3 with the insulating sheet 5 interposed therebetween. The insulating sheet 5 is made of, e.g., an insulating material having thermal conductivity, and has a three-layer structure in which both surfaces of an electrical insulating layer are sandwiched by bonding layers.

The power element T1 is a semiconductor chip, and for example, an insulated-gate bipolar transistor (IGBT) or a metal oxide semiconductor field-effect transistor (MOSFET) can be used. The power element T1 is adhered to an upper surface of the first die pad portion 1c of the first lead frame 1 by a solder material 6 in advance. A bonding pad (not shown) of the power element T1 and the plurality of the leads of first lead frame 1 are electrically connected by a wire 7 made of, e.g., aluminum, etc. The bonding pad and the first relay lead 1b in the power element T1 are electrically connected together by a wire 8 made of aluminum, etc.

Instead of the wire made of aluminum, a ribbon made of aluminum, or a clip made of copper may be used as the wires 7 and 8. The ribbon or the clip has a cross sectional area larger than that of the wire, and has a lower interconnection resistance, resulting in reducing power loss.

The control element T2 is a semiconductor chip having a control unit for controlling the power element T1, and for example, the semiconductor chip includes a drive circuit and an overcurrent protection circuit, etc. The control element T2 is adhered to an upper surface of the second die pad portion 2c of the second lead frame 2 by a silver (Ag) paste material 9 in advance. A bonding pad (not shown) of the control element T2 and the plurality of leads of the second lead frame 2 are electrically connected by a wire 10 made of, e.g., gold (Au), etc.

The second die pad portion 2c of the second lead frame 2 holding the control element T2 is arranged above the power element T1 to be substantially parallel to an upper surface of the power element T1, thereby covering at least part of the wires 7 and 8 in the power element T1. As a result, the second die pad portion 2c of the second lead frame 2 is arranged in a space between the control element T2 and the wires 7 and 8 which are connected to the power element T1. Therefore, part of electromagnetic wave noise generated in the wires 7 and 8 which are output signal lines of the power element T1 is blocked by the second die pad portion 2c, thereby making it possible to prevent the part of electromagnetic wave noise from transmitting to the control element T2. As a result, occurrence of malfunction of the control element T2 can be reduced.

Similarly, in the embodiment, the second lead frame 2 is arranged so as to cover at least part of the first lead frame 1. Therefore, electromagnetic wave noise generated from the power element T1 is blocked by the second lead frame 2 located below the control element T2. As a result, the amount of the electromagnetic wave noise reaching the control element T2 decreases, thereby reducing occurrence of malfunction of the control element T2. As a result, performance reliability of the semiconductor device can be improved.

A plating layer made of a magnetic material, such as nickel (Ni), etc. may be formed in at least part of the second die pad portion 2c of the second lead frame 2 (preferably, a lower surface of the second die pad portion 2c). With this formation, the electromagnetic wave noise generated from the power element T1 can be absorbed by the plating layer, thereby making it possible to further reduce influence of the electromagnetic wave noise generated from the power element T1 on the control element T2.

[Conduction Path]

Figure 2:
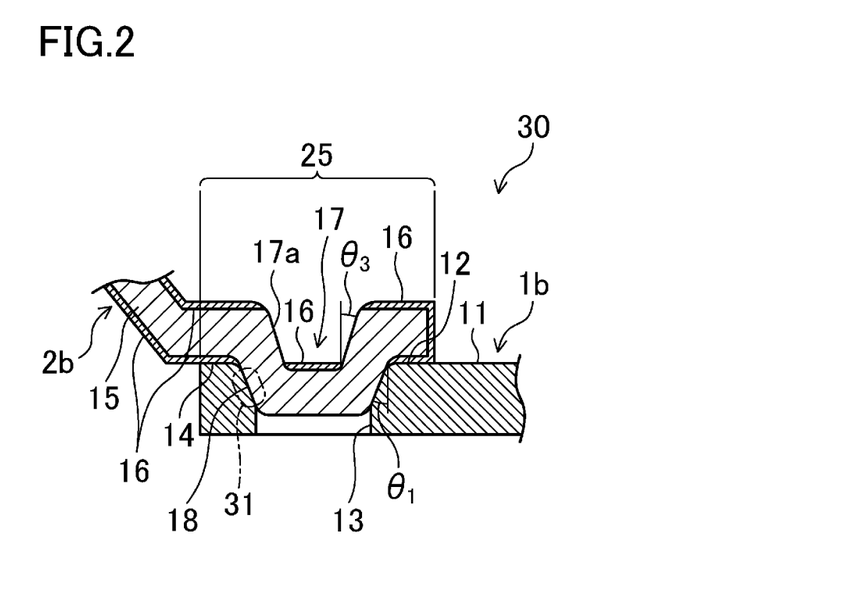
FIG. 2 shows a conduction path according to the embodiment of the present invention, and is an enlarged cross sectional view of a region including a bonding portion 25 in FIG. 1.

FIG. 2 illustrates an enlarged cross sectional structure of a region 30 including a bonding portion 25 shown in FIG. 1.

Hereinafter, in the embodiment, the region 30 will be described as a conduction path according to the embodiment. The region 30 includes the bonding portion 25 bonding the first relay lead 1b of the first lead frame 1 and the second relay lead 2b of the second lead frame 2 together. Therefore, in FIG. 2, the first relay lead 1b is referred to as a first conduction path forming plate 11, and the second relay lead 2b is referred to as a second conduction path forming plate 15.

A first connection portion 12 which is an upper surface of the first conduction path forming plate 11 is provided with a through hole 13 passing through the first conduction path forming plate 11 in a direction perpendicular to the first conduction path forming plate 11. A second connection portion 14 which is a lower surface of the second conduction path forming plate 15 is provided with a press-fit portion 17 press-fitted into the through hole 13 of the first conduction path forming plate 11.

The first conduction path forming plate 11 and the second conduction path forming plate 15 are made of, e.g., copper (Cu). A front surface and a back surface of the second conduction path forming plate 15 are provided with a plating film 16 made of nickel (Ni). The plating film 16 does not necessarily have to be formed on the second conduction path forming plate 15. However, it is preferable to form the plating film 16 for the reasons described later. Although the plating film 16 may be formed on the first conduction path forming plate 11, it is preferably formed in at least the second conduction path forming plate 15.

In the case of a general power element T1, it is preferable that the first conduction path forming plate 11 which is one example of the first lead frame 1 has a thickness of 0.05 mm or more and 1.0 mm or less. It is preferable that the second conduction path forming plate 15 which is one example of the second lead frame 2 has a thickness of 0.05 mm or more and 1.0 mm or less as well as the first conduction path forming plate 11. Each thickness of the conduction path forming plates 11 and 15 is optionally determined by a value of a current fed through the power element T1.

In the structure shown in FIG. 2, the thickness of the first conduction path forming plate 11 is preferably similar to or larger than that of the second conduction path forming plate 15. That is because the structure of the embodiment requires considering mutual processability of the first conduction path forming plate 11 and the second conduction path forming plate 15, (in particular, excellent processability of the second conduction path forming plate 15).

It is preferable that the plating film 16 has a thickness of 0.01 μm or more and 10 μm or less, considering tendency for the plating film 16 to be broken when bonding the first conduction path forming plate 11 and the second conduction path forming plate 15 together.

Part of the second conduction path forming plate 15 press-fitted into the through hole 13 of the first conduction path forming plate 11 forms the press-fit portion 17. A side surface of the press-fit portion 17 and a wall surface of the through hole 13 form an inclined bonding surface 18 inclined relative to a normal line of an overlap surface formed by overlapping the first conduction path forming plate 11 and the second conduction path forming plate 15. A surface opposite to the inclined bonding surface 18 in the press-fit portion 17 of the second conduction path forming plate 15 is referred to as an inclined press-fit surface 17a.

A method of forming the press-fit portion 17 constituting the bonding portion 25 will be described later in detail.

Considering provision of suitable conduction property between the first conduction path forming plate 11 and the second conduction path forming plate 15 along with sufficient bond strength in the inclined bonding surface 18, an inclined angle $\theta_1$ of the inclined bonding surface 18 is set to be 35° in the embodiment. The inclined angle $\theta_1$ of the inclined bonding surface 18 is preferably 20° or more and 50° or less in view of the balance between the conduction property and the bond strength stated above.

If the through hole 13 has a circular plane shape, a diameter of the through hole 13 is preferably similar to the thickness of the first conduction path forming plate 11. Therefore, in the embodiment, the diameter of the through hole 13 is set to be 0.05 mm or more and 1.0 mm or less.

In the embodiment, the inclined bonding surface 18 includes the wall surface of the through hole 13 and the side surface of the press-fit portion 17, and its inclined angle is $\theta_1$. The inclined angle $\theta_1$ of the inclined bonding surface 18 is more than zero degrees, and therefore, a bonding area between the first conduction path forming plate 11 and the second conduction path forming plate 15 is larger than that when the inclined angle is zero degrees. This structure improves the conduction property between the first conduction path forming plate 11 and the second conduction path forming plate 15. However, the inclined angle $\theta_1$ is too large, the bond strength between the through hole 13 and the press-fit portion 17 may be declined. Therefore, in the embodiment, the inclined angle $\theta_1$ is set to be 20° or more and 50° or less, and more preferably, 35°.

Figure 3:
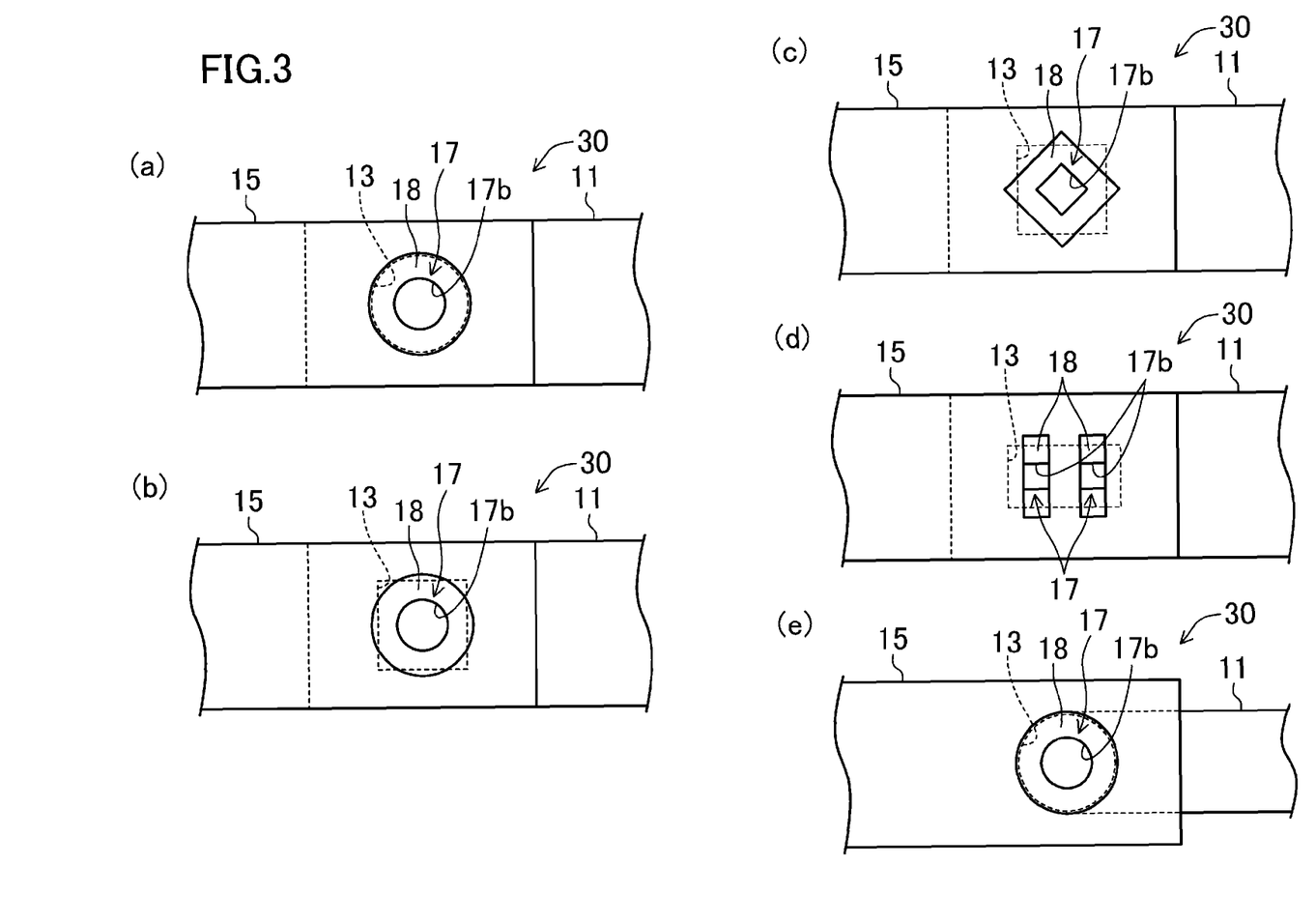
FIG. 3(a) shows the conduction path according to the embodiment of the present invention, and is an enlarged plan view of the region including the bonding portion in FIG. 1.
FIGS. 3(b)-3(e) are enlarged plan views of regions including bonding portions of conduction paths according to modified examples.

FIG. 3(a) illustrates a planer structure of the conduction path including the bonding portion 25 shown in FIG. 2. As shown in FIG. 3(a), the through hole 13 has a circular plane shape, an impression 17b by a tip of a punch which is a press-fit tool in this case has a circular plane shape. If desired conditions of the area and the bond strength of the inclined bonding surface 18 can be satisfied, the through hole 13 does not necessarily have to have a circular plane shape, and it may have an elliptical shape or an oblong shape.

As shown in FIGS. 3(b) and 3(c), if desired conditions of the area and the bond strength of the inclined bonding surface 18 are satisfied, the plane shape of the through hole 13 may be a square shape, or a polygonal shape such as a rectangular, etc., as modified examples. In FIG. 3(b), the impression 17b has a circular plane shape. In this case, the inclined bonding surface 18 between the first conduction path forming plate 11 and the second conduction path forming plate 15 is formed so as to be digged into the center portion of each side of the through hole 13. In FIG. 3(c), the impression 17b has a square plane shape, and each of four sides of it is rotated 45° relative to each side of the through hole 13. In this case, the inclined bonding surface 18 between the first conduction path forming plate 11 and the second conduction path forming plate 15 is also formed so as to be digged into the center portion of each side of the through hole 13.

As a modified example shown in FIG. 3(d), if the through hole 13 has a rectangular plane shape, and two pressed surfaces by the punch are formed inside the through hole 13 with an interval therebetween, the inclined bonding surface 18 between the first conduction path forming plate 11 and the second conduction path forming plate 15 is also formed so as to be digged into two sides of the through hole 13 facing each other.

In a modified example shown in FIG. 3(e), instead of providing the first conduction path forming plate 11 with the through hole 13, a tip of the first conduction path forming plate 11 is provided with a semi-circular cut-out, and the punch is pressed against part of the second conduction path forming plate 15 in the periphery of the semi-circular cut-out of the first conduction path forming plate 11, thereby forming the inclined bonding surface 18.

In this way, if desired conditions of the area and the bond strength of the inclined bonding surface 18 can be satisfied, the side surface of the press-fit portion 17 in the second conduction path forming plate 15 has a plane shape so that it causes metal flow (plastic flow) together with the wall surface of the through hole 13 in the first conduction path forming plate 11, and newly formed surfaces in the side surface of the press-fit portion 17 and the wall surface of the through hole 13 can form the inclined bonding surface 18.

The through hole 13 provided in the first conduction path forming plate 11 does not necessarily have to penetrate. Instead of the through hole 13, a recess portion of a hole portion which does not penetrate may be used as long as the inclined bonding surface 18 formed of the newly formed surfaces is generated in the press-fit portion 17 between the first connection portion 12 of the first conduction path forming plate 11 and the second connection portion 14 of the second conduction path forming plate 15, and the bond strength can be maintained and the electrical resistance can be reduced. In the embodiment, the element including the through hole and the recessed portion is referred to as the hole portion.

Figure 4:
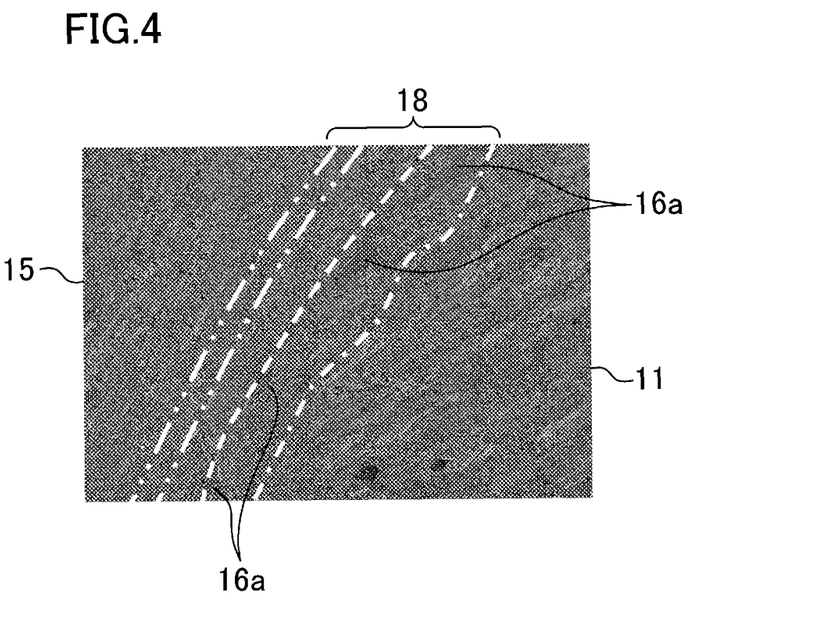
FIG. 4 is a cross sectional view of an inclined bonding surface of the conduction path the according to the embodiment, and is a SEM (scanning electron microscope) image of a region 31 shown in FIG. 2.

FIG. 4 illustrates a cross section of the inclined bonding surface in the conduction path according to the embodiment, and a SEM image of a region 31 shown in FIG. 2.

The SEM image produced and observed by the inventors of the present application shows that the wall surface of the through hole 13 and the side surface of the press-fit portion 17 constituting the inclined bonding surface 18 are formed by the newly formed surfaces which are metal flow surfaces (plastic flow surfaces). The inclined bonding surface 18 is formed of the newly formed surfaces, thereby rubbing the wall surface of the through hole 13 and the side surface of the press-fit portion 17 together to make it possible to achieve integration of the metals, not simple contact of the metals. At this time, in the wall surface of the through hole 13 and the side surface of the press-fit portion 17, the plating film 16 made of nickel (Ni) becomes crystal grains 16a and they are dispersed along substantially the inclined bonding surface 18. In this way, as a result of the metals made of copper, the electrical resistance between the first connection portion 12 of the first conduction path forming plate 11 and the second connection portion 14 of the second conduction path forming plate 15 is extremely lowered. Therefore, improvement of conduction property in the conduction path according to the embodiment is also facilitated by the integration of the metals which are identical to each other (integration of copper).

The plating film 16 is not necessarily limited to nickel (Ni), and if conditions are satisfied, a metal, e.g., nickel palladium (NiPd) or silver (Ag), etc. can be used.

When aluminum (Al), instead of copper (Cu), is used for the first conduction path forming plate 11 and the second conduction path forming plate 15, it is not necessary to provide a plating film. The inventors of the present application confirmed that, if silicon (Si) is added to the aluminum constituting the respective conduction path forming plates 11 and 15, the added silicon atoms function as crystal grains of the metal atoms constituting the plating film.

[Method of Manufacturing Conduction Path]

A method of manufacturing the conduction path according to the embodiment will be described hereinafter with reference to FIGS. 5(a)-(d).

Figure 5:
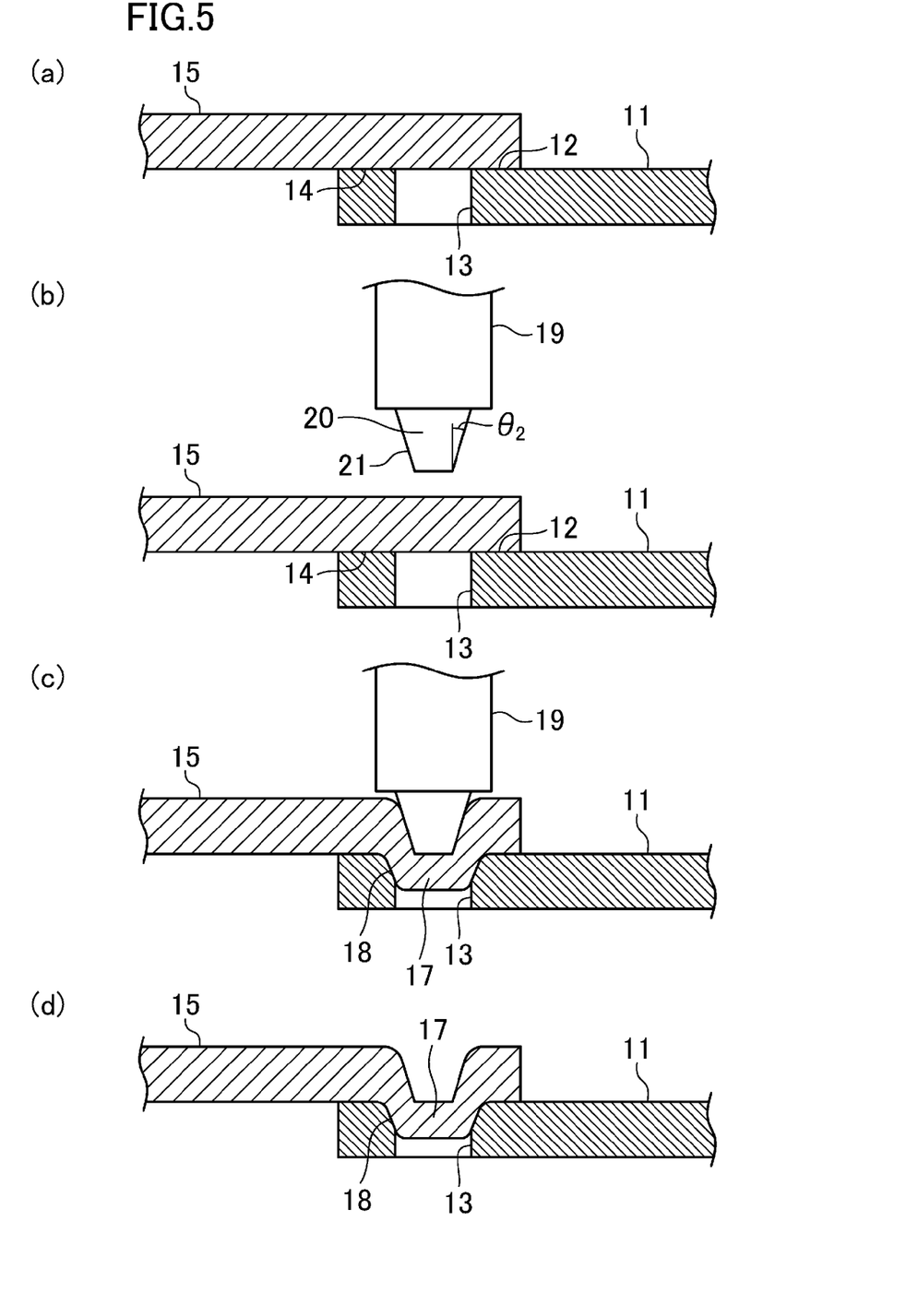
FIGS. 5(a)-5(d) are schematic cross sectional views for showing steps of manufacturing the resin-encapsulated semiconductor device according to the embodiment of the present invention in the order of the steps performed.

First, as shown in FIG. 5(a), the first connection portion 12 of the first conduction path forming plate 11 which is one of the end portion of first conduction path forming plate 11 and in which the through hole 13 is provided, and the second connection portion 14 which is one of the end portion of the second conduction path forming plate 15 overlap each other.

Next, as shown in FIG. 5(b), as a press-fit tool, for example, a punch 19 is arranged above a position opposing the through hole 13 in the second connection portion 14 of the second conduction path forming plate 15. The punch 19 has a tip 20 which press-fits toward the through hole 13, and a pressing surface 21 which is an outer circumferential surface of the tip 20. When a plane surface constituting the second connection portion 14 is press-fitted into the inside of the through hole 13 by the tip of the punch 19, the pressing surface 21 prevents an outside portion of the through hole 13 in the second connection portion 14 from floating up from an upper surface of the first conduction path forming plate 11. In other words, the pressing surface 21 is provided to press the plane portion constituting the second connection portion 14 toward the first conduction path forming plate 11. A material of the punch 19 is preferably, e.g., so-called a hard metal including tungsten carbide (WC) as a main component when the first conduction path forming plate 11 and the second conduction path forming plate 15 are made of copper (Cu). A lower surface of the tip 20 of the punch 19 preferably has a diameter half of the diameter of the through hole 13, in other words, 0.025 mm or more and 0.5 mm or less. If the through hole 13 does not have a circular plane shape, the lower surface of the tip 20 preferably has a diameter half of the minimum opening diameter of the through hole 13.

The inventors of the present invention, through their various attempts, found that an inclined angle (taper angle) $\theta_2$ in the pressing surface 21 of the tip 20 of the punch 19 is preferably 30° or more and 60° or less in order to achieve the inclined bonding surface 18 shown in FIG. 2, having the inclined angle $\theta_1$ of 20° or more and 50° or less. In other words, the inclined angle $\theta_2$ of the tip 20 of the punch 19 is preferably 30° or more and 60° or less relative to a normal line (moving direction of the punch 19) of an upper surface of the second conduction path forming plate 15. In order to achieve the inclined angle $\theta_1$ of 35°, the inclined angle $\theta_2$ is preferably 45°. In the embodiment, the inclined angle $\theta_2$ of the pressing surface 21 of the punch 19 is equal to an inclined angle $\theta_3$ of the inclined press-fit surface shown in FIG. 2.

Next, as shown in FIG. 5(c), the punch 19 is moved down by driving means which is not shown, thereby press-fitting part of the second conduction path forming plate 15 located on an upper part of the through hole 13 into the through hole 13.

As a result, as shown in FIG. 5(d), the press-fit portion 17 press-fitted into the through hole 13 of the first conduction path forming plate 11 is formed in the second connection portion 14 of the second conduction path forming plate 15. Besides, the inclined bonding surface 18 is formed in the wall surface of the through hole 13 and the side surface of the press-fit portion 17 by the formation of the press-fit portion 17 formed by press-fitting the second connection portion 14 of the second conduction path forming plate 15 into the through hole 13.

In addition, the wall surface of the through hole 13 and the side surface of the press-fit portion 17 constituting the inclined bonding surface 18 are plastic flow surfaces (metal flow surfaces) as shown in FIG. 4, and therefore, in the wall surface of the through hole 13 and the side surface of the press-fit portion 17, the metals are not simply in contact with each other, but are integrated with each other. As a result of allowing the inclined bonding surface 18 to serve as a metal flow surface (plastic flow surface), a resistance value between the first connection portion 12 and the second connection portion 14 can be 10 mΩ or less. In other words, as a result of allowing the inclined bonding surface 18 to serve as a metal flow surface (plastic flow surface), conduction property in the conduction path including the first conduction path forming plate 11 and the second conduction path forming plate 15 can have an extremely excellent value. Specifically, the electrical resistance of the conduction path according to the embodiment can be an extremely small, approximately one hundredth of the conventional one.

As a result of consideration of the inventors of the present invention based on FIG. 4 stated above, they found that, in the embodiment, the plating film 16 made of nickel (Ni) and formed on the second conduction path forming plate 15 further improves the conduction property of the conduction path. This improvement will be described in detail hereinafter.

The first conduction path forming plate 11 is made of copper, and an oxide film is formed on a surface of the first conduction path forming plate 11 if the first conduction path forming plate 11 is generally stored. As well as the surface, an oxide film is also formed in the wall surface of the through hole 13.

In contrast, the second conduction path forming plate 15 is made of copper, and the plating film 16 made of nickel (Ni) is formed on the surface of the second conduction path forming plate 15. In this way, when the second conduction path forming plate 15 having the surface on which the plating film 16 is formed is press-fitted into the through hole 13 of the first conduction path forming plate 11, in the press-fit portion 17 of the second conduction path forming plate 15, the plating film 16 on the surface is press-fitted into the through hole 13 while shaving off the oxide film of the wall surface of the through hole 13. That is because a hardness of the nickel constituting the plating film 16 (Vickers hardness: 150 Hv-700 Hv) is larger than a hardness of the copper of the oxide film (Vickers hardness: about 120 Hv), and therefore, when friction between them occurs, the oxide film of the copper of the wall surface of the through hole 13 is shaved off by the plating film 16.

This phenomenon can be explained also by the fact that, as described in FIG. 4, the nickel shaving off the oxide film of the copper of the wall surface of the through hole 13 surface exists as the crystal grains 16a in a dispersed state (discrete state).

If the plating film 16 is formed on the surface of the second conduction path forming plate 15, the formation of the oxide film is generally reduced on the surface of the second conduction path forming plate 15, whereby the newly formed surface is more likely to be formed on the surface of the second conduction path forming plate 15.

The second conduction path forming plate 15 has a thickness which is 80% or less of a thickness of the first conduction path forming plate 11, thereby making it possible to easily press-fit the second conduction path forming plate 15 into the through hole 13 by the tip 20 of the punch 19.

As described above, according to the conduction path in the embodiment, the electrical resistance value of the conduction path is lower than that of conventional conduction paths, and its conduction property is significantly improved. Therefore, the resin-encapsulated semiconductor device in which the conduction path according to the embodiment is used for electrically connecting lead frames can reduce heat generated from the lead frame, and performance of heat dissipation from the device itself can be improved.

INDUSTRIAL APPLICABILITY

Conduction paths for allowing a current to flow, semiconductor devices using such conduction paths, and methods for manufacturing such conduction paths and such semiconductor devices according to the present invention can be applicable to, for example, a connection between a semiconductor switching element and a control circuit in an air conditioner, a serial connection or parallel connection between batteries or capacitors in an electric car, and etc.

DESCRIPTION OF REFERENCE CHARACTERS

T1 Power Element
T2 Control Element
1 First Lead Frame
1b First Relay Lead
1c First Die Pad Portion
2 Second Lead Frame
2b Second Relay Lead
2c Second Fie Pad Portion
3 Dissipating Plate
4 Outer Body
5 Insulating Sheet
6 Solder material
7 Wire
8 Wire
9 Silver Paste Material
10 Wire
11 First Conduction Path Forming Plate
12 First Connection Portion
13 Through Hole
14 Second Connection Portion
15 Second Conduction Path Forming Plate
16 Plating film
16a Crystal Grains
17 Press-fit Portion
17a Inclined Press-fit Surface
17b Impression
18 Inclined Bonding surface
19 Punch
20 Tip
21 Pressing Surface
25 Bonding portion
30, 31 Region

The invention claimed is:

1. A conduction path, comprising:
a first conductor forming a first conduction path, having a plate shape, made of a first metal, and having a hole; and
a second conductor forming a second conduction path, having a plate shape, made of a second metal, and having a press-fit portion press-fitted into the hole, wherein:
an inclined bonding surface inclined relative to a normal line of a surface of the first conductor other than the hole, on which a part of the second conductor is overlapped, is formed in a wall surface of the hole and a side surface of the press-fit portion,
a bonding portion, at which newly formed surfaces of the hole and the press-fit portion, respectively, are bonded together, is formed in a region located in a periphery of the inclined bonding surface, the newly formed surfaces being surfaces formed by plastic flow caused when the press-fit portion is press-fitted into the hole,
at the bonding portion, the first metal and the second metal are integrated with each other and wherein the hole is a through hole.

2. The conduction path of claim 1, wherein:
a plating film made of a third metal is formed on the second conductor except for, at least, the inclined bonding surface and a tip surface of the press-fit portion of the second conductor, and
a hardness of the third metal is greater than that of the first metal and the second metal.

3. The conduction path of claim 2, wherein
the first metal and the second metal are copper, and
the third metal is nickel.

4. The conduction path of claim 2, wherein
in the bonding portion, a plurality of crystal grains made of the third metal are dispersed along the inclined bonding surface.

5. The conduction path of claim 1, wherein
on the first conductor, a metal oxide film is formed in a region except for the inclined bonding surface.

6. The conduction path of claim 1, wherein
an inclined angle of the inclined bonding surface relative to the normal line is 20° or more and 50° or less.

7. The conduction path of claim 1, wherein
a thickness of the second conductor is thinner than that of the first conductor.

8. A semiconductor device, comprising:
the conduction path of claim 1;
a semiconductor chip electrically connected to the conduction path; and
an outer body including the conduction path and a resin material encapsulating the semiconductor chip.

9. The conduction path of claim 1, wherein
a thickness of the press-fit portion of the second conductor at a center of the hole is smaller than a thickness of a part of the second conductor disposed on the first conductor.

* * * * *